(12) United States Patent
Feng et al.

(10) Patent No.: US 11,670,713 B2
(45) Date of Patent: Jun. 6, 2023

(54) LDMOS AND FABRICATING METHOD OF THE SAME

(71) Applicant: UNITED MICROELECTRONICS CORP., Hsin-Chu (TW)

(72) Inventors: Chung-Yen Feng, Hsinchu County (TW); Chen-An Kuo, Taoyuan (TW); Ching-Wei Teng, Taoyuan (TW); Po-Chun Lai, Taoyuan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 17/884,599

(22) Filed: Aug. 10, 2022

(65) Prior Publication Data

US 2022/0384638 A1 Dec. 1, 2022

Related U.S. Application Data

(62) Division of application No. 17/224,108, filed on Apr. 6, 2021, now Pat. No. 11,616,139.

(30) Foreign Application Priority Data

Feb. 24, 2021 (CN) .......................... 202110207876.3

(51) Int. Cl.
| | |
|---|---|
| *H01L 21/28* | (2006.01) |
| *H01L 29/78* | (2006.01) |
| *H01L 29/10* | (2006.01) |
| *H01L 29/66* | (2006.01) |
| *H01L 21/285* | (2006.01) |
| *H01L 21/74* | (2006.01) |
| *H01L 29/45* | (2006.01) |

(52) U.S. Cl.
CPC .... *H01L 29/7816* (2013.01); *H01L 21/28518* (2013.01); *H01L 21/743* (2013.01); *H01L 29/1087* (2013.01); *H01L 29/1095* (2013.01); *H01L 29/45* (2013.01); *H01L 29/66681* (2013.01)

(58) Field of Classification Search
CPC ... H01L 21/28; H01L 21/28518; H01L 21/74; H01L 21/743; H01L 29/10; H01L 29/1087; H01L 29/1095; H01L 29/45; H01L 29/66; H01L 29/66681; H01L 29/78; H01L 29/7816
USPC ........................................................ 257/343
See application file for complete search history.

(56) References Cited

U.S. PATENT DOCUMENTS

| | | | |
|---|---|---|---|
| 5,869,875 | A | 2/1999 | Hebert |
| 5,929,488 | A | 7/1999 | Endou |
| 2008/0169515 | A1 | 7/2008 | Hwang |
| 2013/0001576 | A1 | 1/2013 | Jung |
| 2013/0277741 | A1 | 10/2013 | Guowei |
| 2015/0235898 | A1 | 8/2015 | Vick |
| 2019/0214497 | A1 | 7/2019 | Verma |

*Primary Examiner* — Fazli Erdem
(74) *Attorney, Agent, or Firm* — Winston Hsu

(57) ABSTRACT

An LDMOS includes a semiconductor substrate. A well is disposed within the semiconductor substrate. A body region is disposed within the well. A first gate electrode is disposed on the semiconductor substrate. A source electrode is disposed at one side of the first gate electrode. The source electrode includes a source contact area and numerous vias. The vias connect to the source contact area. The vias extend into the semiconductor substrate. A first drain electrode is disposed at another side of the first gate electrode and is opposed to the source electrode.

11 Claims, 5 Drawing Sheets

LDMOS AND FABRICATING METHOD OF THE SAME

CROSS REFERENCE TO RELATED APPLICATIONS

This application is a division of U.S. application Ser. No. 17/224,108, filed on Apr. 6, 2021. The content of the application is incorporated herein by reference.

BACKGROUND OF THE INVENTION

1. Field of the Invention

The present invention relates to a lateral double-diffused MOSFET (LDMOS) and a method of fabricating the same, and more particularly, to an LDMOS with numerous vias inserted into a source of the LDMOS and a method of fabricating the same.

2. Description of the Prior Art

Double-diffused MOS (DMOS) play an important role among power devices with high-voltage processing capabilities. Generally speaking, DMOS includes vertical double-diffused MOS (VDMOS) and lateral double-diffused MOS (LDMOS). LDMOS have been widely used in high-voltage operating environments, such as CPU power supply, power management system, AC/DC converter, high-power or high-band power amplifier, etc. because of their high operating bandwidth, high operating efficiency, and the planar structure that is easy to integrate with other integrated circuits.

To increase the linear drain current of an LDMOS, a P-type body region are disposed at a shallower region. However, the shallower position of the P-type body region leads to current leakage because of accumulation of electrons on the substrate.

SUMMARY OF THE INVENTION

In view of this, the present invention provides a new structure of an LDMOS which can increase the linear drain current and to prevent current leakage.

According to a preferred embodiment of the present invention, an LDMOS includes a semiconductor substrate. A well is disposed within the semiconductor substrate. A body region is disposed within the well. A first gate electrode is disposed on the semiconductor substrate. A source electrode is disposed at one side of the first gate electrode, wherein the source electrode includes a source contact area and numerous vias connecting to the source contact area and extending into the semiconductor substrate. A first drain electrode is disposed at another side of the first gate electrode and is opposed to the source electrode.

According to another preferred embodiment of the present invention, a fabricating method of an LDMOS includes providing a semiconductor substrate, wherein a well is disposed within the semiconductor substrate, a body region is disposed within the well, a gate electrode is disposed on the semiconductor substrate, a drain and a source are respectively disposed in the semiconductor substrate at two side of the gate electrode. Next, a salicide block (SAB) layer is formed to cover the source, wherein the SAB layer includes a plurality of rectangular profiles. Later, a dielectric layer is formed to cover the semiconductor substrate. After that, the dielectric layer and the SAB layer are etched to form a source contact hole directly on the source, wherein the source contact hole includes a trench and numerous via holes. The via holes connect to the source contact hole, penetrate the SAB layer and extend into the source, and the trench is only within the dielectric layer. Finally, a conductive layer is formed to fill in the source contact hole to form a source electrode.

According to yet another preferred embodiment of the present invention, a fabricating method of an LDMOS, includes providing a semiconductor substrate, wherein a well is disposed within the semiconductor substrate, a body region is disposed within the well, a gate electrode is disposed on the semiconductor substrate, a drain and a source are respectively disposed in the semiconductor substrate at two side of the gate electrode. Later, a silicide process is performed to form a silicide layer covering the source and the drain. Subsequently, a dielectric layer is formed to cover the gate electrode, the drain and the source. Next, a first etching process is performed to etch the dielectric layer, the silicide layer and the semiconductor substrate to form numerous via holes penetrating the silicide layer and extending into the source. After that, a second etching process is performed to etch the dielectric layer to form a trench in the dielectric layer directly on the source, wherein the trench connects to via holes to form a source contact hole. Finally, a conductive layer is formed to fill in the source contact hole and the conductive layer serves as a source electrode connecting to the silicide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 depict a fabricating method of an LDMOS according to a first preferred embodiment of the present invention, wherein:

FIG. 2 is a fabricating stage following FIG. 1.

FIG. 3 to FIG. 5 depict a fabricating method of an LDMOS according to a second preferred embodiment of the present invention, wherein:

FIG. 4 is a fabricating stage following FIG. 3; and

FIG. 5 is a fabricating stage following FIG. 4.

DETAILED DESCRIPTION

Figure 1:
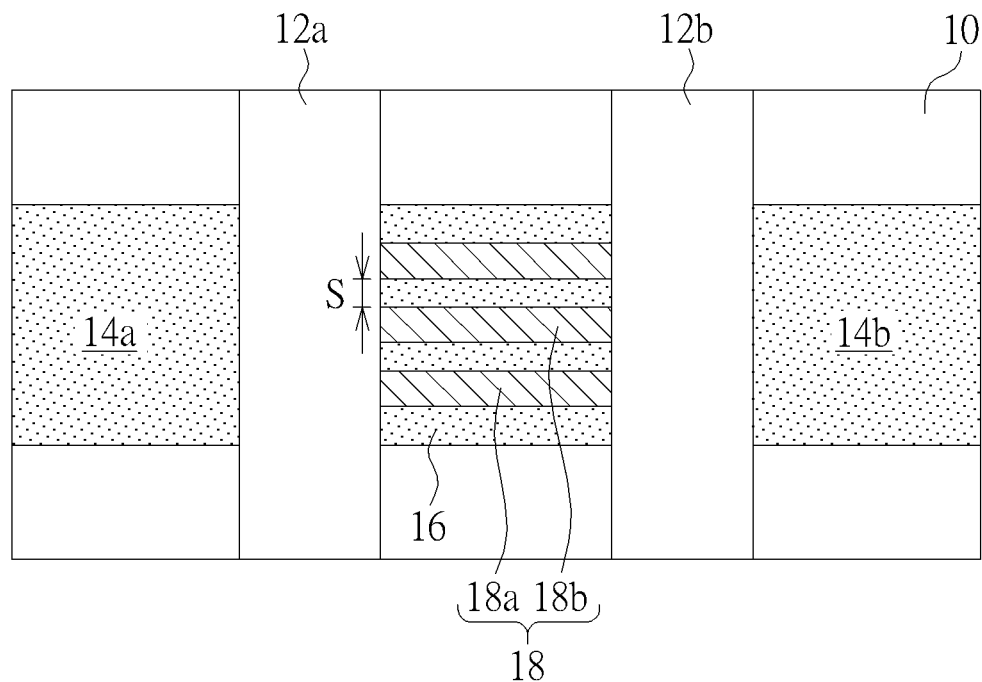
Figure 2:
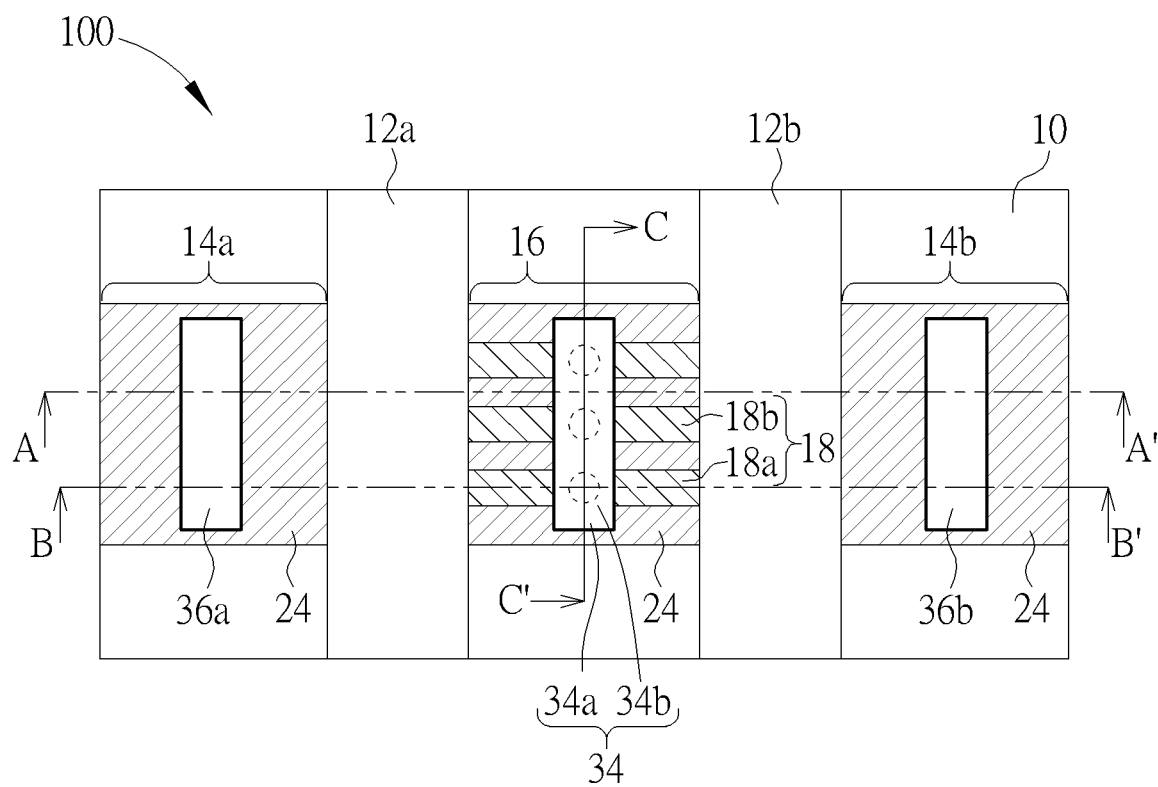
Figure 2A:
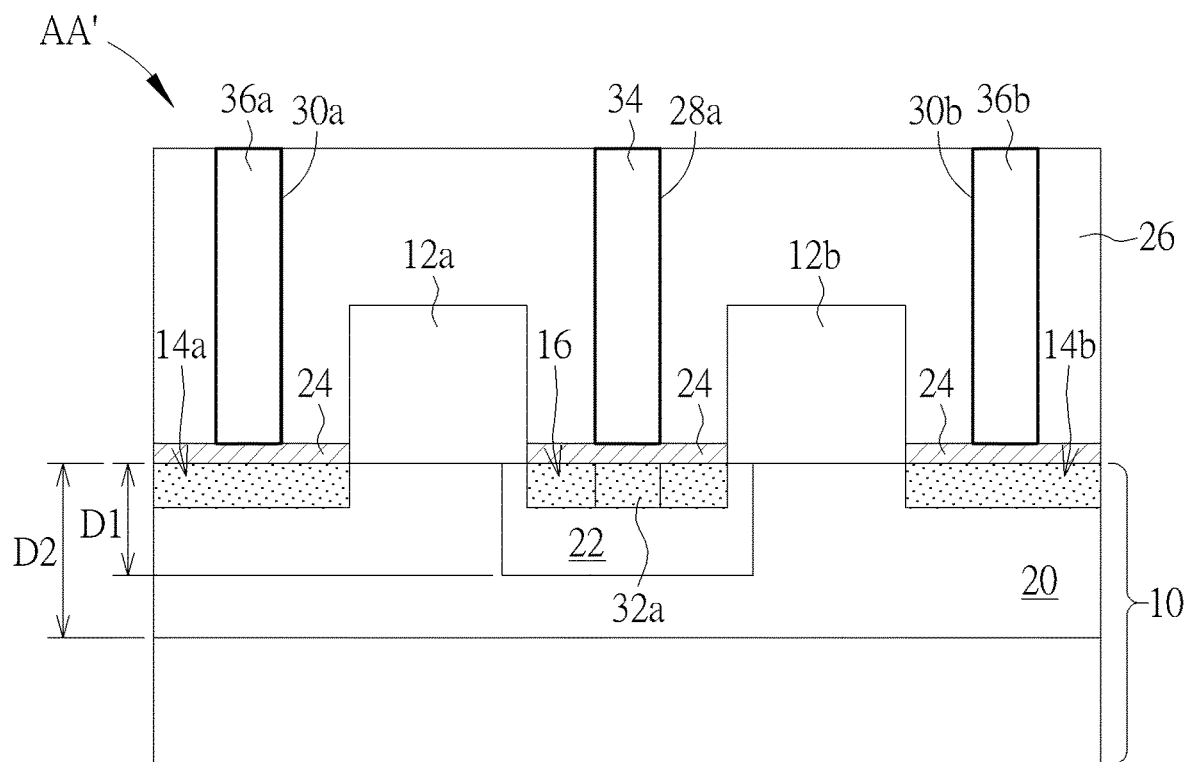
FIG. 2A depicts a section view taken along line AA' in FIG. 2.
Figure 2B:
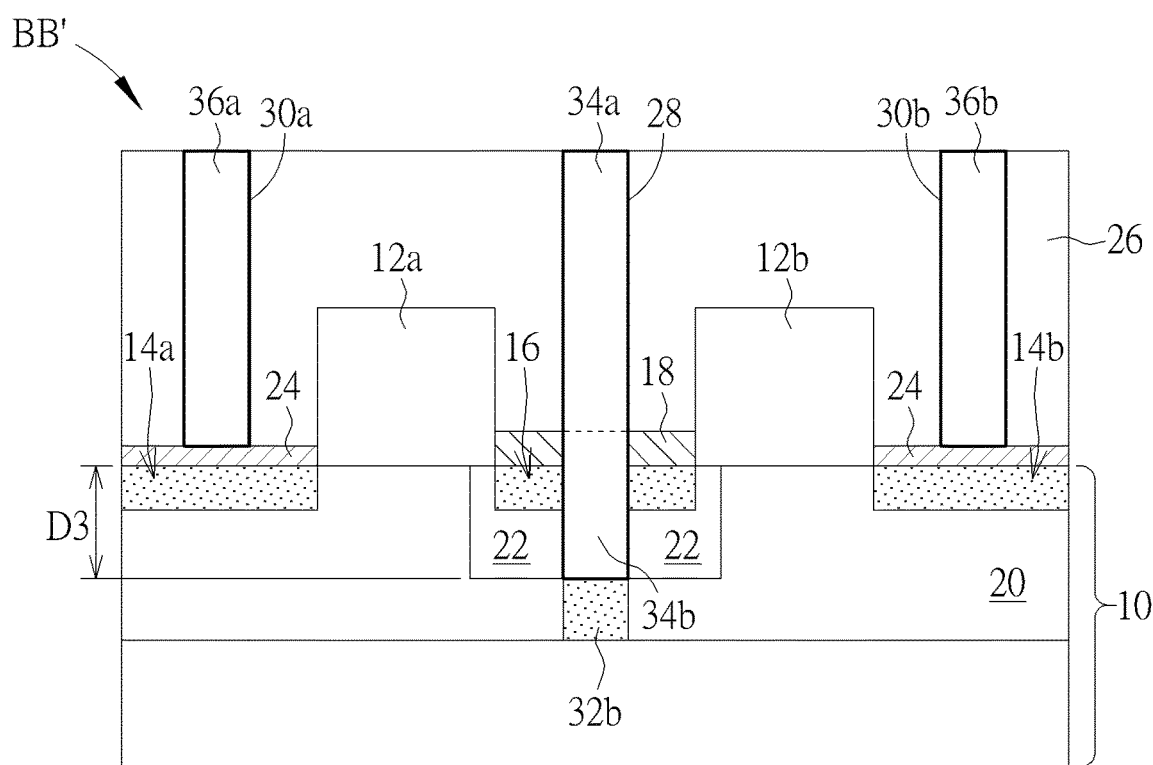
FIG. 2B depicts a section view taken along line BB' in FIG.
Figure 2C:
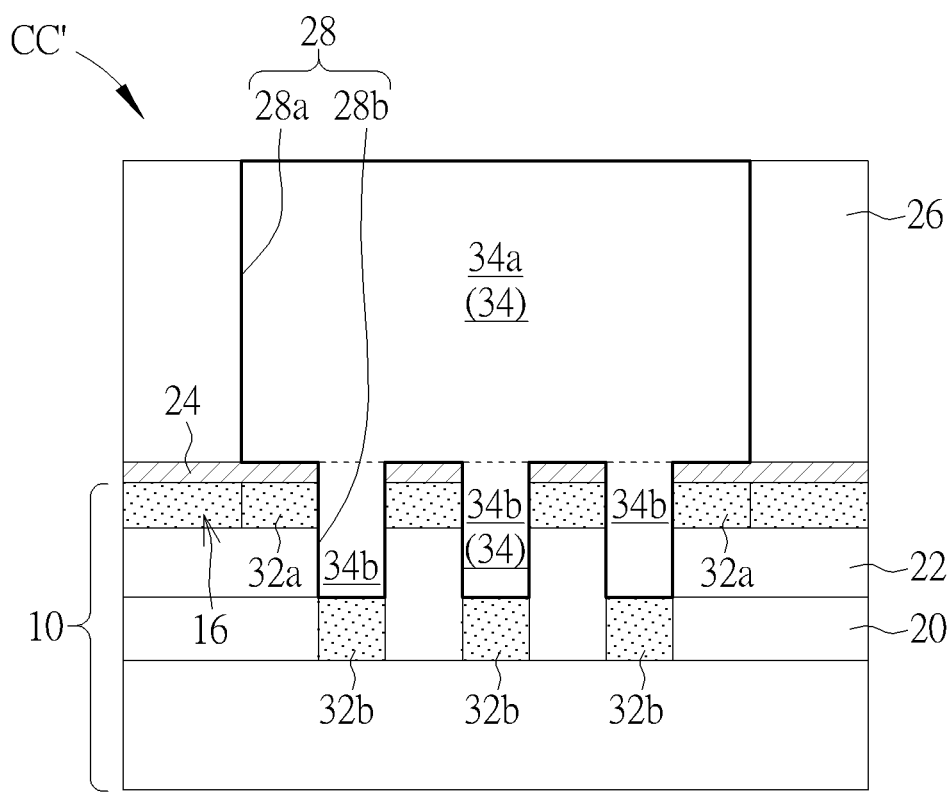
FIG. 2C depicts a section view taken along line CC' in FIG. 2.

FIG. 1 to FIG. 2 depict a fabricating method of an LDMOS according to a first preferred embodiment of the present invention. FIG. 2A depicts a section view taken along line AA' in FIG. 2. FIG. 2B depicts a section view taken along line BB' in FIG. 2. FIG. 2C depicts a section view taken along line CC' in FIG. 2.

As shown in FIG. 1, a semiconductor substrate 10 is provided. A first gate electrode 12a and a second gate electrode 12b are disposed on the semiconductor substrate 10. The first gate electrode 12a and the second gate electrode 12b respectively include a cap layer (not shown) and a gate dielectric layer (not shown). A first drain 14a and a source 16 are disposed in the semiconductor substrate 10 at two side of the first gate electrode 12a. The source 16 is in the semiconductor substrate 10 which is between the first gate electrode 12a and the second gate electrode 12b. A second drain 14b is disposed in the semiconductor substrate 10 at a side of the second gate electrode 12 and is opposite to the source 16. Then, a salicide block (SAB) layer 18 is formed to cover the source 16. It is noteworthy that the SAB layer 18 at the source 16 includes numerous rectangular profiles 18a/18b. A space S is between adjacent rectangular profiles 18a/18b so as to make the source 16 does not be entirely covered by the SAB 18. Part of the semiconductor substrate 10 is exposed through the space S. The first drain 14a and the second drain 14b do not covered by the SAB layer 18. Please refer to FIG. 2A, a well 20 is disposed in the semiconductor substrate 10. A body region 22 is disposed with in the well 20. A first depth D1 is between a bottom of the body region 22 and a top surface of the semiconductor substrate 10. A second depth D2 is between a bottom of the well 20 and the top surface of the semiconductor substrate 10, and the second depth D2 is greater than the first depth D1. That is, the bottom of the well 20 is deeper than the bottom of the body region 22.

As shown in FIG. 2, FIG. 2A, FIG. 2B and FIG. 2C, a silicide process is performed to form a silicide layer 24 on the source 16, the first drain 14a and the second drain 14b. Later, a dielectric layer 26 is formed to cover the semiconductor substrate 10. For the sake of clarity, the dielectric layer 26 is omitted in FIG. 2. Then, the dielectric layer 26, the SAB layer 18 and the source 16 are etched to form a source contact hole 28 in the dielectric layer 26 directly on the source 16 and extending into the source 16. The source contact hole 28 includes a trench 28a and numerous via holes 28b. Each of the via holes 28b connects to the trench 28a. Each of the via holes 28b penetrates the SAB layer 18 and extends into the source 16. The trench 28a is only in the dielectric layer 26.

During the formation of the trench 28a, the dielectric layer 26 directly on the first drain 14a and the second drain 14b is etched at the same etching step as the trench 28a to form a first drain contact hole 30a and a second drain contact hole 30b. The silicide layer 24 on the first drain 14a is exposed through the first drain contact hole 30a. The silicide layer 24 on the second drain 14b is exposed through the second drain contact hole 30b. After the first drain contact hole 30a, the second drain contact hole 30b and the trench 28a are formed within the dielectric layer 26 or in other words, after the first drain contact hole 30a, the second drain contact hole 30b and the trench 28a penetrate the dielectric layer 26, etchant is changed to etch the SAB layer 18 on the source 16 and the semiconductor substrate 10 under the SAB layer 18 to form numerous via holes 28b in the SAB layer 18 and in the semiconductor substrate 10. The via holes 28b extend into the source 16. In FIG. 2B, via holes 28b and the trench 28a are divided by dotted lines. After forming via holes 28b, an ion implantation process is performed to form doping regions 32b in the well 20 respectively under each of the via holes 28b.

According to another preferred embodiment of the present invention, the dielectric layer 28, the SAB layer 18 and the semiconductor substrate 10 are etched in sequence to form numerous via holes 28b. Later, the dielectric layer 26 is etched again to form a trench 28a in the dielectric layer 26 on the source 16, to form a first drain contact hole 30a on the first drain 14a and to form a second drain contact hole 30b on the second drain 14b.

Later, a conductive layer fills in the source contact hole 28, the first drain contact hole 30a and the second drain contact hole 30b. The conductive layer filling in the source contact hole 28 serves as a source electrode 34. The conductive layer filling in each of the via holes 28b form numerous via 34b. The conductive layer filling in the trench 28a form a source contact region 34a. The source contact region 34a connects to each of the vias 34b. Each of the vias 34b does not contact each other. Furthermore, the conductive layer filling in the first drain contact hole 30a serves as a first drain electrode 36a. The conductive layer filling in the second drain contact hole 30b serves as a second drain electrode 36b. Now, an LDMOS 100 of the present invention is completed.

In the following description, FIG. 2, FIG. 2A, FIG. 2B and FIG. 2C are used to illustrate an LDMOS fabricated by utilizing the first preferred embodiment of the present invention. As shown in FIG. 2, FIG. 2A, FIG. 2B and FIG. 2C, an LDMOS 100 includes a semiconductor substrate 10. A well 20 is disposed within the semiconductor substrate 10. A body region 22 is disposed within the well 20. A first gate electrode 12a and a second gate electrode 12b are disposed on the semiconductor substrate 10. The first gate electrode 12a and the second gate electrode 12b respectively include a cap layer (not shown) and a gate dielectric layer (not shown). A first drain 14a and a source 16 are disposed in the semiconductor substrate 10 at two side of the first gate electrode 12a. The source 16 is between the first gate electrode 12a and the second gate electrode 12b. A second drain 14b is disposed in the semiconductor substrate 10 at a side of the second gate electrode 12 and is opposite to the source 16. A first depth D1 is between a bottom of the body region 22 and a top surface of the semiconductor substrate 10. A second depth D2 is between a bottom of the well 20 and the top surface of the semiconductor substrate 10, and the second depth D2 is greater than the first depth D1. That is, the bottom of the well 20 is deeper than the bottom of the body region 22. The semiconductor substrate 10 is of a first conductive type, the well 20 is of a second conductive type, the body region 22 is of the first conductive type. Both the first drain 14a and the second drain 14b are of second conductive type. The source 16 is primarily a second conductive type region. But in the second conductive type region, a doping region 32a with the first conductive type is disposed therein. The first conductive type is different from the second conductive type. In this embodiment, the first conductive type is P-type, and the second conductive type is N-type. In other embodiment, the first conductive type is N-type and the second conductive type is P-type.

A silicide layer 24 covers the source 16, the first drain 14a and the second drain 14b. It is noteworthy that an SAB layer 18 is disposed on the source 16. The SAB layer 18 includes numerous rectangular profiles 18a/18b. A space S (please refer to FIG. 1 for the positions of the space S and rectangular profiles 18a/18b) is disposed between adjacent rectangular profiles 18a/18b. Therefore, the silicide layer 24 covers the space S. There is no SAB layer 18 on the drain 14a and the second drain 14b. Therefore, the silicide layer 24 completely covers the first drain 14a and the second drain 14b.

A source electrode 34 is disposed at one side of the first gate electrode 12a, wherein the source electrode 34 includes a source contact area 34a and numerous vias 34b connecting to the source contact area 34a. The vias 34b extend into the semiconductor substrate 10 at the source 16. In details, each of the vias 34b respectively penetrates the SAB layer 18 and extends into the source 16. The source contact area 34a is completely on the silicide layer 24. The source contact area 34a does not penetrate the silicide layer 24. That is, the silicide layer 24 is between the source contact area 34a and the top surface of the semiconductor substrate 10. Furthermore, the number of the vias 34b should be greater than 2. In the first preferred embodiment, there are three vias 34b shown for example. But the number of the vias 34b can be adjusted based on different requirements. Moreover, a third depth D3 is between an end of one of the vias 34b and the top surface of the semiconductor substrate 10, and the third depth D3 should be at least the same as the first depth D1. That is, the end of one of the vias 34b should be at least as deep as the bottom of the body region 22. In another embodiment, the third depth D3 can be greater than the first depth D1. In other words, the end of one of the vias 34b is deeper than the bottom of the body region 22. Numerous doping regions 32b are in the well 20 respectively under each of the vias 34b. The doping regions 32b are of the first conductive type. Each of the doping regions 32b does not contact each other.

A first drain electrode 36a is disposed at another side of the first gate electrode 12a and the first drain electrode 36a is opposed to the source electrode 34a. The first drain electrode 36a contacts the silicide layer 24 on the first drain 14a. A second drain electrode 36b is disposed on another side of the second gate electrode 12b, and the second drain electrode 36b is opposed to the source electrode 34. The second drain electrode 36b contacts the silicide layer 24 on the second drain 14b. The first drain electrode 36a and the second drain electrode 36b do not penetrate the silicide layer 24, extend into the first drain 14a or the second drain 14b. The source electrode 34, the first drain electrode 36a and the second drain electrode 36b may independently include Cu, W, Al, Ti, Ta, TiN, WN or other conductive materials.

Figure 3:
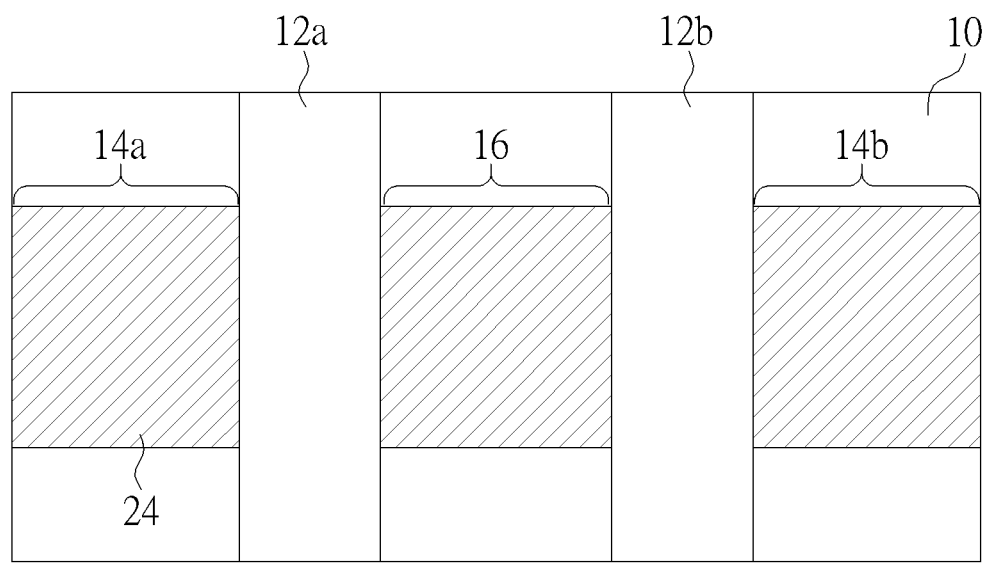
Figure 4:
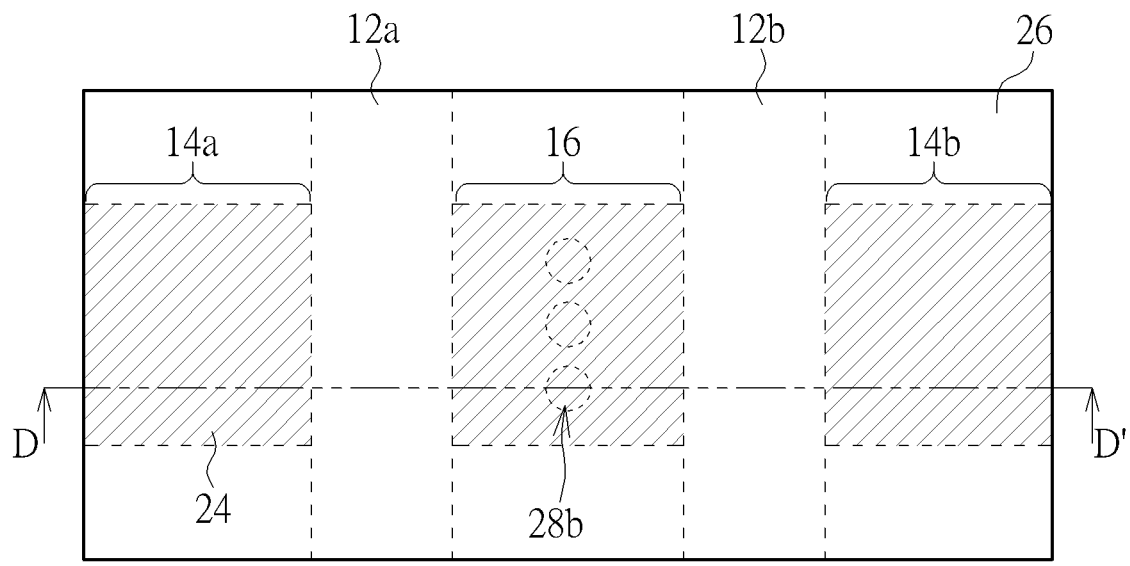
Figure 4A:
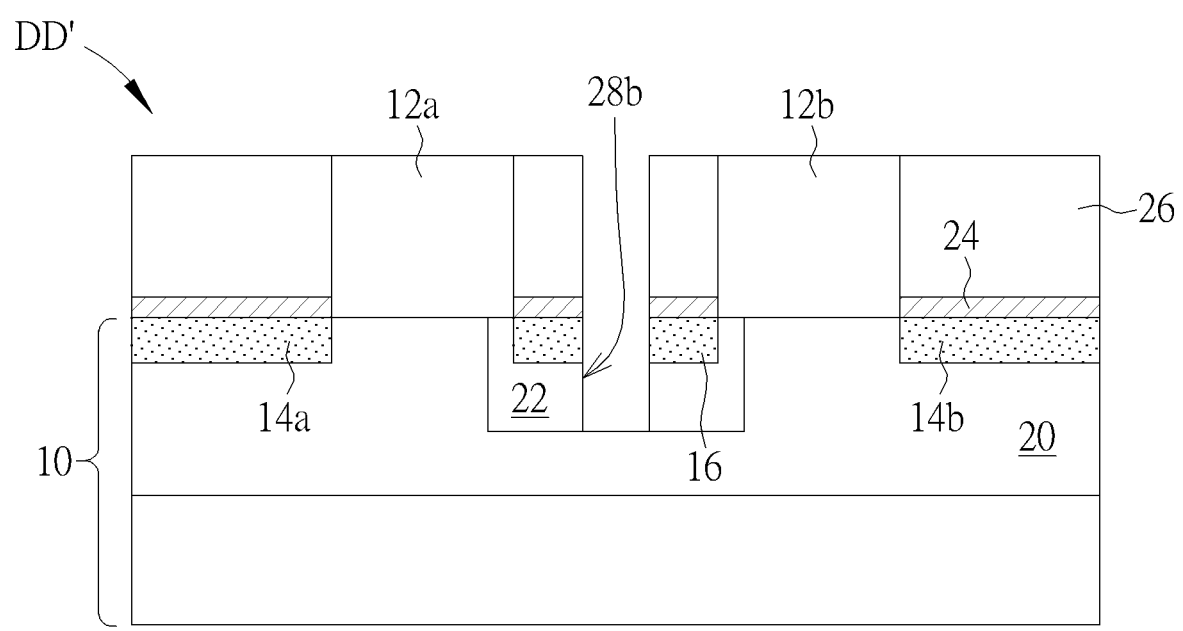
FIG. 4A depicts a section view taken along line DD' in FIG. 4.
Figure 5:
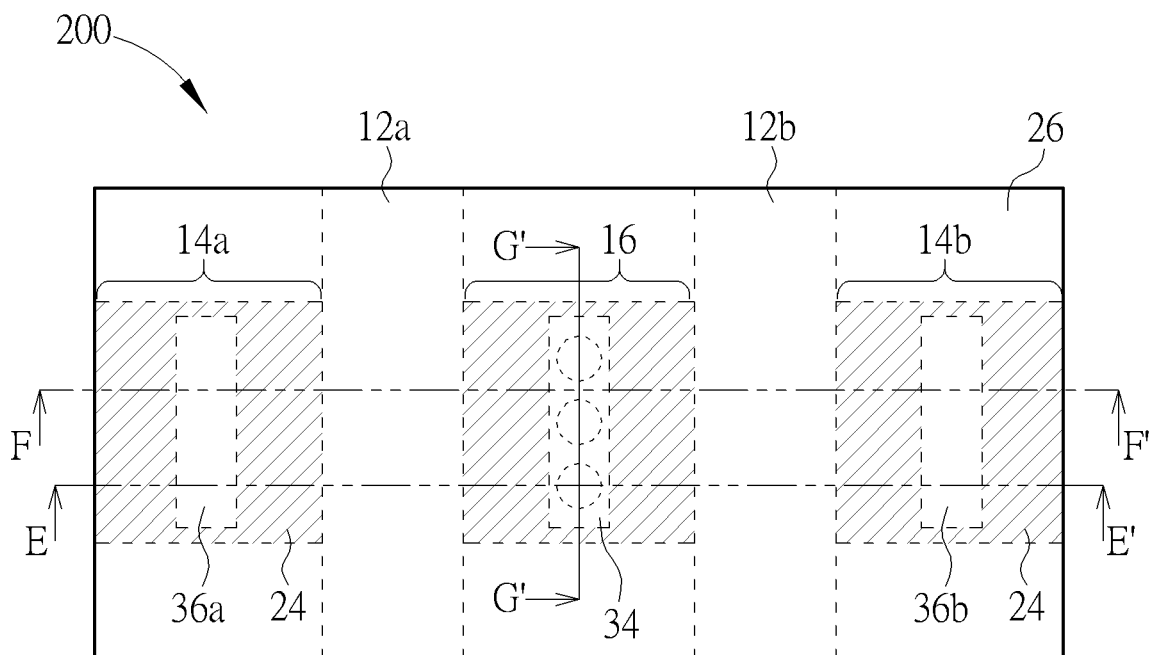
Figure 5A:
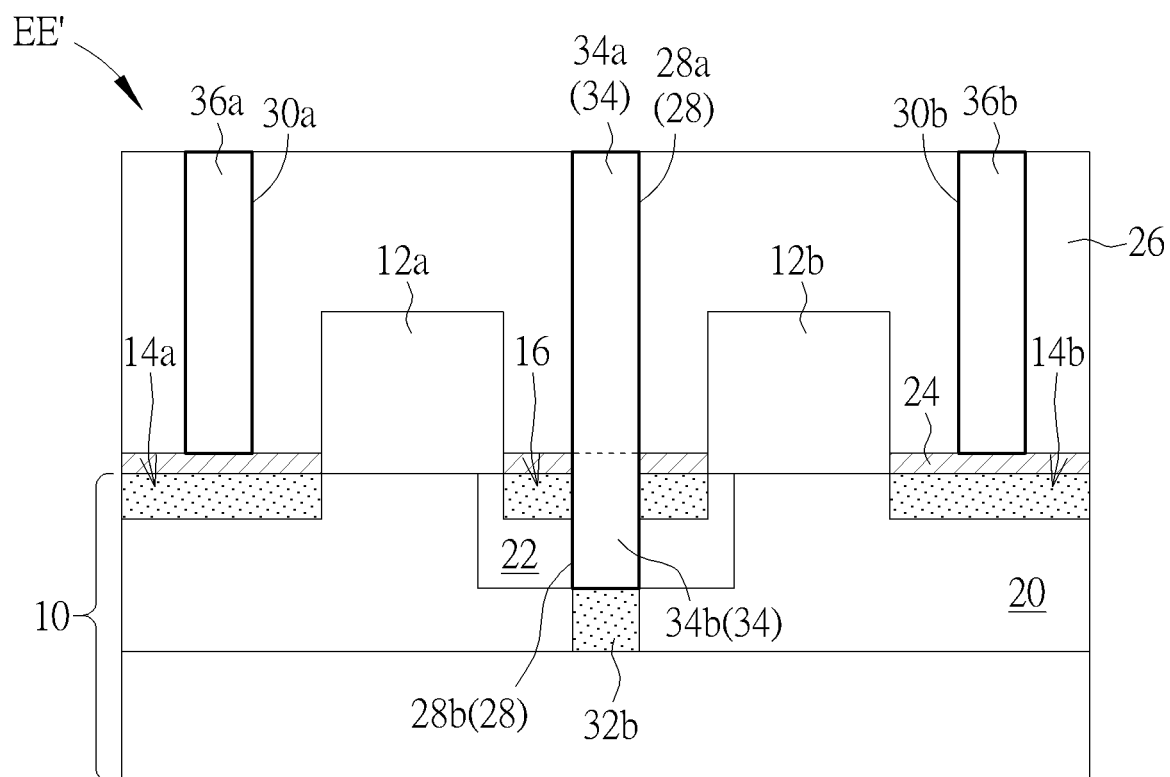
FIG. 5A depicts a section view taken along line EE' in FIG. 5.

FIG. 3 to FIG. 5 depict a fabricating method of an LDMOS according to a second preferred embodiment of the present invention. FIG. 4A depicts a section view taken along line DD' in FIG. 4. FIG. 5A depicts a section view taken along line EE' in FIG. 5. Elements in the second preferred embodiment which are substantially the same as those in the first preferred embodiment are denoted by the same reference numerals; an accompanying explanation is therefore omitted.

As shown in FIG. 3, a fabricating method of an LDMOS includes providing a semiconductor substrate 10. A first gate electrode 12a and a second gate electrode 12b are disposed on the semiconductor substrate 10. Please refer to FIG. 4A first, a well 20 is disposed in the semiconductor substrate 10. A body region 22 is disposed with in the well 20. Please refer to FIG. 3 again. A first drain 14a and a source 16 are disposed in the semiconductor substrate 10 respectively at two side of the first gate electrode 12a. The source 16 is in the semiconductor substrate 10 which is between the first gate electrode 12a and the second gate electrode 12b. A second drain 14b is disposed in the semiconductor substrate 10 at a side of the second gate electrode 12 and is opposite to the source 16. Next, a silicide process is performed to form a silicide layer 24 covering the source 16, the first drain 14a and the second drain 14b.

As shown in FIG. 4 and FIG. 4A, a dielectric layer 26 is formed to cover the first gate electrode 12a, the second gate electrode 12b, the first drain 14a, the second drain 14b and the source 16. Later, a first etching process is performed to etch the dielectric layer 26, the silicide layer 24 and the semiconductor substrate 10 to form numerous via holes 28b penetrating the dielectric layer 26, the silicide layer 24 and extending into the source 16. As shown in FIG. 5 and FIG. 5A, a second etching process is performed to etch the dielectric layer 26 to form a trench 28a, a first drain contact hole 30a and a second drain contact hole 30b. The trench 28a is in the dielectric layer 26 directly on the source 16. Each of the via holes 28b connects to the trench 28a so as to form a source contact hole 28. Part of the silicide layer 24 is exposed through the trench 28a. The first drain contact hole 30a and the second drain contact hole 30b respectively on the first drain 14a and the second drain 14b. The silicide layer 24 is exposed from the first drain contact hole 30a and the second drain contact hole 30b.

Then, an ion implantation process is performed to form doping regions 32b in the well 20 respectively under each of the via holes 28b. Next, as shown in FIG. 5A, a conductive layer is formed to fill in the source contact hole 28, the first drain contact hole 30a and the second drain contact hole 30b. The conductive layer filling in the source contact hole 28 serves as a source electrode 34. The source electrode 34 connects to the silicide layer 24. The conductive layer filling in the first drain contact hole 30a serves as a first drain electrode 36a. The conductive layer filling in the second drain contact hole 30b serves as a second drain electrode 36b. Now, an LDMOS 200 of the present invention is completed.

In the following description, FIG. 2A, FIG. 2C, FIG. 5 and FIG. 5A are used to illustrate an LDMOS fabricated by utilizing the second preferred embodiment of the present invention. The difference between the LDMOS 200 and the LDMOS 100 is that the LDMOS 200 of the second preferred embodiment does not have a SAB layer. Other elements in the LDMOS 200 are the same as those in the LDMOS 100. Therefore, only the sectional view taken along line EE' is different from the sectional view of the LDMOS 100. Therefore, the different sectional view of the LDMOS 200 is shown in FIG. 5A. The sectional view of LDMOS 200 taken along line FF' is the same as the sectional view of LDMOS 100 taken along line AA'; therefore please refer to FIG. 2A. The sectional view of LDMOS 200 taken along line GG' is the same as the sectional view of LDMOS 100 taken along line CC'; therefore please refer to FIG. 2C.

The source electrode 34 of the LDMOS 200 includes a source contact area 34a and numerous vias 34b connect to the source contact area 34a. Each of the vias 34b extends into the semiconductor substrate 10 at the source 16. In details, because there is no SAB layer in the LDMOS 200, each of the vias 34b respectively penetrates the silicide layer 24 and extends into the source 16. The source contact area 34a is entirely on the silicide layer 24 and does not penetrate the silicide layer 24. Therefore, the silicide layer 24 is between the source contact area 34a and the top surface of the semiconductor substrate 10.

Generally, the body region is intentionally disposed at a shallow region of a semiconductor substrate to increase the linear drain current of the LDMOS. However, electrons accumulated on the semiconductor substrate and current leakage occurs because the body region is at the shallow region. To solve the current leakage, the source electrode of the present invention is inserted into the source and extends to contact the body region. In this way, the current leakage can be prevented. Moreover, the linear drain current will not decreased due to the vias because there is only several vias inserted into the source.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of an LDMOS, comprising:
providing a semiconductor substrate, wherein a well is disposed within the semiconductor substrate, a body region is disposed within the well, a gate electrode is disposed on the semiconductor substrate, a drain and a source are respectively disposed in the semiconductor substrate at two side of the gate electrode;
forming a salicide block (SAB) layer covering the source, wherein the SAB layer comprises a plurality of rectangular profiles;
forming a dielectric layer covering the semiconductor substrate;
etching the dielectric layer and the SAB layer to form a source contact hole directly on the source, wherein the source contact hole comprises a trench and a plurality of via holes, the plurality of via holes connect to the source contact hole, penetrate the SAB layer and extend into the source, and the trench is only within the dielectric layer; and
forming a conductive layer filling in the source contact hole to form a source electrode.

2. The fabricating method of the LDMOS of claim 1, wherein the source electrode comprises a source contact area and a plurality of vias connecting to the source contact area, each of the plurality of vias is respectively in each of the via holes, and the source contact area is in the trench.

3. The fabricating method of the LDMOS of claim 2, wherein a first depth is between a bottom of the body region and a top surface of the semiconductor substrate, a second depth is between a bottom of the well and the top surface of the semiconductor substrate, and the second depth is greater than the first depth.

4. The fabricating method of the LDMOS of claim 3, wherein a third depth is between an end of one of the plurality of vias and the top surface of the semiconductor substrate, and the third depth is greater than the first depth.

5. The fabricating method of the LDMOS of claim 3, wherein a third depth is between an end of one of the plurality of vias and the top surface of the semiconductor substrate, and the third depth is the same as the first depth.

6. A fabricating method of an LDMOS, comprising:
providing a semiconductor substrate, wherein a well is disposed within the semiconductor substrate, a body region is disposed within the well, a gate electrode is disposed on the semiconductor substrate, a drain and a source are respectively disposed in the semiconductor substrate at two side of the gate electrode;
performing a silicide process to form a silicide layer covering the source and the drain;
forming a dielectric layer covering the gate electrode, the drain and the source;
performing a first etching process to etch the dielectric layer, the silicide layer and the semiconductor substrate to form a plurality of via holes penetrating the silicide layer and extending into the source;
performing a second etching process to etching the dielectric layer to form a trench in the dielectric layer directly on the source, wherein the trench connects to the plurality of via holes, and the trench and the plurality of via holes form a source contact hole; and
forming a conductive layer filling in the source contact hole to form a source electrode connecting to the silicide layer.

7. The fabricating method of the LDMOS of claim 6, wherein the source electrode comprises a source contact area and a plurality of vias connecting to the source contact area, each of the plurality of vias is respectively in each of the via holes, and the source contact area is in the trench.

8. The fabricating method of the LDMOS of claim 7, wherein a first depth is between a bottom of the body region and a top surface of the semiconductor substrate, a second depth is between a bottom of the well and the top surface of the semiconductor substrate, and the second depth is greater than the first depth.

9. The fabricating method of the LDMOS of claim 8, wherein a third depth is between an end of one of the plurality of vias and the top surface of the semiconductor substrate, and the third depth is greater than the first depth.

10. The fabricating method of the LDMOS of claim 8, wherein a third depth is between an end of one of the plurality of vias and the top surface of the semiconductor substrate, and the third depth is the same as the first depth.

11. The fabricating method of the LDMOS of claim 8, further comprising after forming the plurality of vias, forming a plurality of doping regions under each of the via holes.

* * * * *